(12) United States Patent
Wilson et al.

(10) Patent No.: US 8,502,554 B2
(45) Date of Patent: Aug. 6, 2013

(54) CURRENT TRANSFORMER ASSEMBLY FOR USE WITH ELECTRICAL MONITORING SYSTEMS AND METHODS OF ASSEMBLING SAME

(75) Inventors: Ronald Wayne Wilson, South Lake Tahoe, CA (US); John Wesley Grant, Gardnerville, NV (US); Charles David Whitefield, II, Carson City, NV (US); Karim Younsi, Ballston Lake, NY (US); Prabhakar Neti, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/243,427

(22) Filed: Sep. 23, 2011

(65) Prior Publication Data

US 2013/0076389 A1   Mar. 28, 2013

(51) Int. Cl.
  *G01R 31/34* (2006.01)
  *G01R 15/18* (2006.01)

(52) U.S. Cl.
  USPC ............ 324/765.01; 324/127; 324/547

(58) Field of Classification Search
  None
  See application file for complete search history.

(56) References Cited

U.S. PATENT DOCUMENTS

| | | | |
|---|---|---|---|
| 3,708,749 A | 1/1973 | Bateman et al. | |
| 4,317,979 A | 3/1982 | Frank et al. | |
| 5,124,642 A * | 6/1992 | Marx | 324/127 |
| 5,659,251 A * | 8/1997 | Wakamatsu | 324/445 |
| 6,191,673 B1 | 2/2001 | Ogura et al. | |
| 6,373,238 B2 | 4/2002 | Lewis et al. | |
| 7,057,485 B2 | 6/2006 | Preusse et al. | |
| 7,145,345 B2 | 12/2006 | Sarkozi et al. | |
| 7,598,724 B2 | 10/2009 | Howell et al. | |
| 7,969,271 B2 | 6/2011 | Lai et al. | |

* cited by examiner

*Primary Examiner* — Minh N Tang
(74) *Attorney, Agent, or Firm* — Fletcher Yoder, P.C.

(57) ABSTRACT

A current transformer assembly for use in an electrical monitoring system is described herein. The current transformer assembly includes a housing including a plurality of shielding members that at least partially define a cavity therein. The housing further includes an inner surface that defines an opening that extends therethough. A first current transformer is positioned within the housing. A second current transformer is positioned within the housing and is spaced a distance from the first current transformer to facilitate reducing electronic noise interference between the first and second current transformers.

18 Claims, 6 Drawing Sheets

CURRENT TRANSFORMER ASSEMBLY FOR USE WITH ELECTRICAL MONITORING SYSTEMS AND METHODS OF ASSEMBLING SAME

BACKGROUND OF THE INVENTION

The subject matter described herein relates generally to monitoring systems and, more particularly, to a current transformer assembly for use with an electrical monitoring system.

At least some known electrical monitoring systems include a current transformer that is configured to scale large primary currents to smaller secondary currents that are easily measurable. Known monitoring systems measure a current flowing to an electrical motor and protect an electrical motor from catastrophic damage after a failure has already occurred. Generally, known current transformers sense a current flowing through a conductor coupled to an electrical motor, and determine whether the sensed current is greater than a predefined current. During operation of known electrical monitoring systems, the monitoring systems operate to selectively disconnect the electrical motor from a power source when a current is sensed that is greater than a predefined current after damage to the motor and/or conductor has already occurred. At least some known electrical motors include stator windings that have electrical insulation. During operation of known electrical motors, the stator winding insulation may become worn and/or damaged. Over time, continued operation of an electric motor may result in damage to the electrical motor.

BRIEF DESCRIPTION OF THE INVENTION

In one embodiment, a current transformer assembly for use in an electrical monitoring system is provided. The current transformer assembly includes a housing including a plurality of shielding members that at least partially define a cavity therein. The housing further includes an inner surface that defines an opening that extends therethough. A first current transformer is positioned within the housing. A second current transformer is positioned within the housing and is spaced a distance from the first current transformer to facilitate reducing electronic noise interference between the first and second current transformers.

In another embodiment, an electrical monitoring system for use in monitoring an operation of an electric motor is provided. The electrical monitoring system includes an electric current monitoring device and a current transformer assembly that is coupled to the electric motor. The current transformer is configured to sense an electric current channeled to the electric motor and to transmit a signal indicative of the sensed current to the electric current monitoring device. The current transformer assembly includes a housing that includes a plurality of shielding members that at least partially define a cavity therein. The housing further includes an inner surface that defines an opening that extends therethough. A first current transformer is positioned within the housing. A second current transformer is positioned within the housing and spaced a distance from the first current transformer to facilitate reducing electronic noise interference between the first and second current transformers.

In yet another embodiment, a method of assembling a current transformer assembly is provided. The method includes coupling an outer shielding member to an inner shielding member to form a housing. The outer shielding member is coupled radially outwardly from the inner shielding member such that a cavity is defined between the inner and outer shielding members. A first current transformer is coupled within the housing cavity. A second current transformer is coupled within the housing cavity such that the second current transformer is spaced a distance from the first current transformer to reduce electronic noise interference between the first and second current transformers.

DETAILED DESCRIPTION OF THE INVENTION

The exemplary methods and systems described herein overcome at least some disadvantages of known monitoring devices by providing a current transformer assembly that includes a high sensitivity current transformer that monitors the operation condition of a stator winding insulation in an electric motor. Moreover, the current transformer assembly described herein includes a housing that encloses a protection current transformer and a high sensitivity current transformer therein. The housing facilitates reducing an amount of electrical noise interference generated between the protection current transformer and high sensitivity current transformer and protects the current transformers from damage. By providing a current transformer assembly that includes a protection current transformer and a high sensitivity current transformer positioned within a single housing, the cost of manufacturing a monitoring device for use in monitoring a stator winding insulation in an electric motor is reduced as compared to known monitoring devices.

Figure 1:
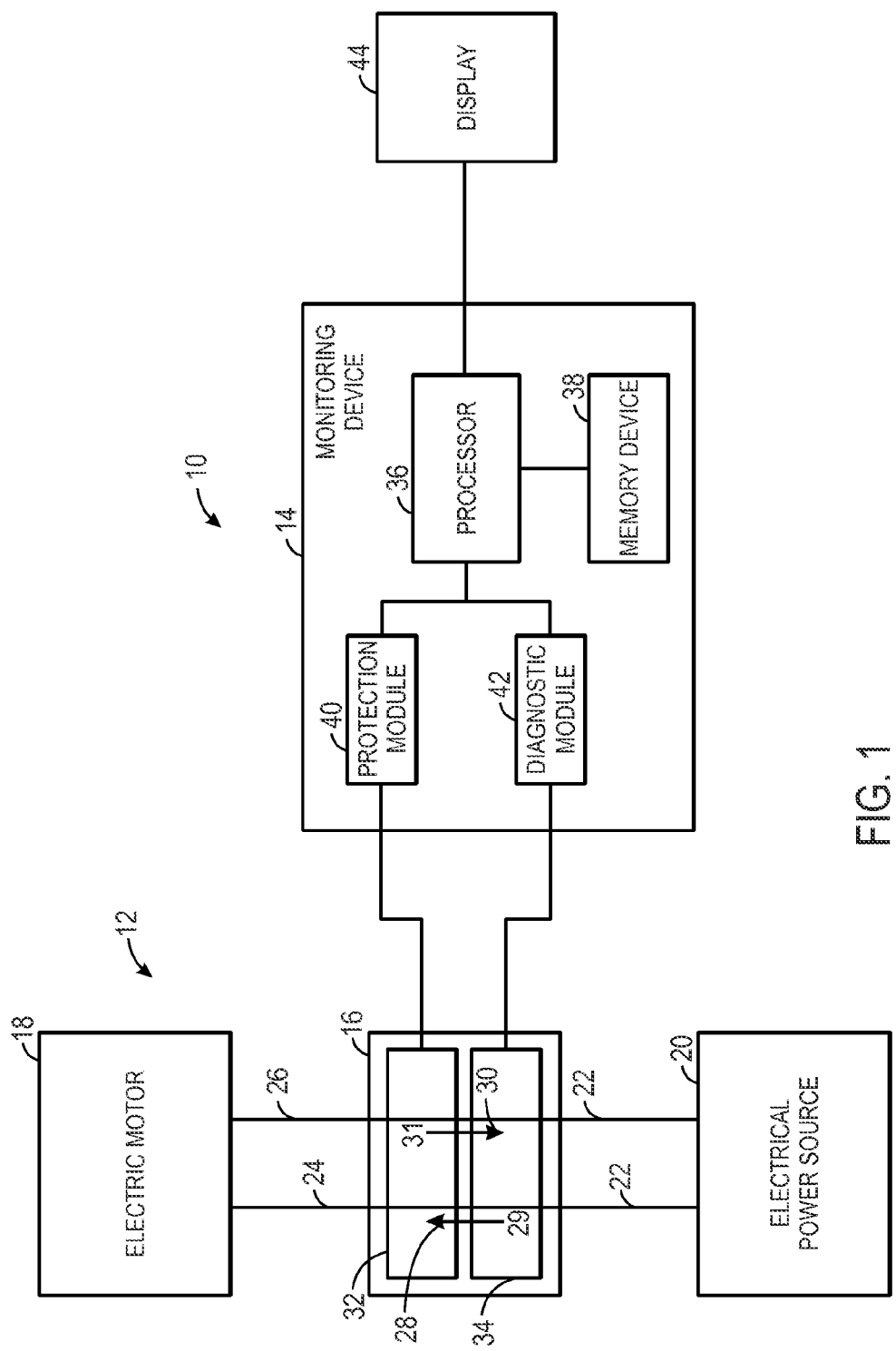
FIG. 1 is a block diagram of an exemplary electrical monitoring system including an exemplary current transformer assembly.

FIG. 1 is a block diagram of an exemplary electrical monitoring system 10 for monitoring an operation of an electric motor system 12. In the exemplary embodiment, electrical monitoring system 10 includes an electric current monitoring device 14 and a current transformer assembly 16 coupled to electric current monitoring device 14. Electric motor system 12 includes a rotating electric motor 18 that is coupled to an electrical power source 20, such as an electric power grid of a utility company. Electric motor 18 includes a plurality of stator windings (not shown), and is coupled to electrical power source 20 via one or more conductors 22. In the exemplary embodiment, electric motor 18 includes a first conductor 24 and a second conductor 26. Conductors 24 and 26 channel substantially similar currents in opposite directions between electric motor 18 and power source 20. Moreover, in the exemplary embodiment, first conductor 24 carries a first current 28 in a first direction, represented by arrow 29, and second conductor 26 carries a second current 30 in a second direction, represented by arrow 31, where second current 30 is approximately equal to first current 28, and where second direction 31 is opposite to first direction 29.

Electrical monitoring system 10 is coupled to electric motor system 12 to monitor a condition of a stator winding insulation in electric motor 18. Moreover, electrical monitoring system 10 enables monitoring of stator winding insulation of electric motor 18 during operation of electric motor 18. In the exemplary embodiment, current transformer assembly 16 is electrically coupled to conductors 24 and 26 to sense leakage current in first and second conductors 24 and 26, and to enable a signal indicative of the sensed leakage current to be transmitted to electric current monitoring device 14. Monitoring device 14 determines a condition of the insulation of the stator windings based at least in part on the received signal.

In the exemplary embodiment, current transformer assembly 16 includes a first current transformer, i.e., a protection current transformer 32, and a second current transformer, i.e., a high sensitivity current transformer 34. In the exemplary embodiment, protection current transformer 32 operates at a first open circuit and signal to noise ratio (S/N), and high sensitivity current transformer 34 operates at a second open circuit gain and S/N ratio that is higher than protection current transformer 32 first open circuit gain and S/N ratio. For example, in one embodiment, protection current transformer 32 includes an open circuit gain equal to about 0.1 mV/mA, and high sensitivity current transformer 34 includes an open circuit gain equal to about 20 mV/mA. Moreover, high sensitivity current transformer 34 may include a S/N ration that is approximately 60 dB higher than the S/N ratio of protection current transformer 32.

In the exemplary embodiment, protection current transformer 32 and high sensitivity current transformer 34 each sense a differential current between first and second conductors 24 and 26, and each transmit a signal that is indicative of the sensed differential current to monitoring device 14. In the exemplary embodiment, High sensitivity current transformer 34 senses a differential current within a first range of current levels. Protection current transformer 32 senses a differential current within a second range of current levels that is higher than the first range of current levels of high sensitivity current transformer 34.

Electrical current monitoring device 14 includes a processor 36 and a memory device 38. Processor 36 is coupled in communication with current transformer assembly 16, and includes any suitable programmable circuit which may include one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The above examples are exemplary only, and thus are not intended to limit in any way the definition and/or meaning of the term "processor." Memory device 38 includes a computer readable medium, such as, without limitation, random access memory (RAM), flash memory, a hard disk drive, a solid state drive, a diskette, a flash drive, a compact disc, a digital video disc, and/or any suitable device that enables processor 36 to store, retrieve, and/or execute instructions and/or data.

In the exemplary embodiment, electrical current monitoring device 14 includes a protection module 40 and a diagnostic module 42 that are each coupled to processor 36. Diagnostic module 42 is coupled in communication with high sensitivity current transformer 34 to receive a monitoring signal from high sensitivity current transformer 34 that is indicative of a current differential between conductors 24 and 26 within the first range of current levels. Diagnostic module 42 calculates a plurality of timebased differential current values with respect to a predefined period of time, and calculates a trending value of the differential current over time. By calculating a trending value of the differential current, diagnostic module 42 enables current leakage within electric motor system 12 to be detected at lower differential current levels, and enables an increase in current leakage to be monitored over time. Protection module 40 is coupled in communication with protection current transformer 32 to receive a monitoring signal from protection current transformer 32 that is indicative of a current differential between conductors 24 and 26 that is within the second range of current levels. In addition, protection module 40 will determine a condition of the stator winding insulation of electric motor 18 to be less than a predefined condition if the sensed current differential is equal to, or greater than, a predefined differential current limit within the second range of current levels.

Monitoring device 14 also includes a display 44 for displaying a notification to a user. Display 44 is coupled to processor 36 and may include a vacuum fluorescent display (VFD) and/or one or more light-emitting diodes (LED). Additionally or alternatively, display 44 may include, without limitation, a liquid crystal display (LCD), a cathode ray tube (CRT), a plasma display, and/or any suitable visual output device capable of displaying graphical data and/or text to a user. In an exemplary embodiment, a condition of electric motor 18, a condition of the stator winding insulation, and/or any other information may be displayed to a user on display 44. In the exemplary embodiment, monitoring device 14 displays a first notification signal to user upon detecting a differential current limit within the first range of current levels, and displays a signal indicative of an increase in sensed differential current over time. Moveover, monitoring device 14 displays a second notification signal to user upon detecting a differential current limit within the second range of current levels. In addition, monitoring device 14 displays a third notification signal upon determining that a condition of the stator winding insulation is less than a predefined condition.

Figure 2:
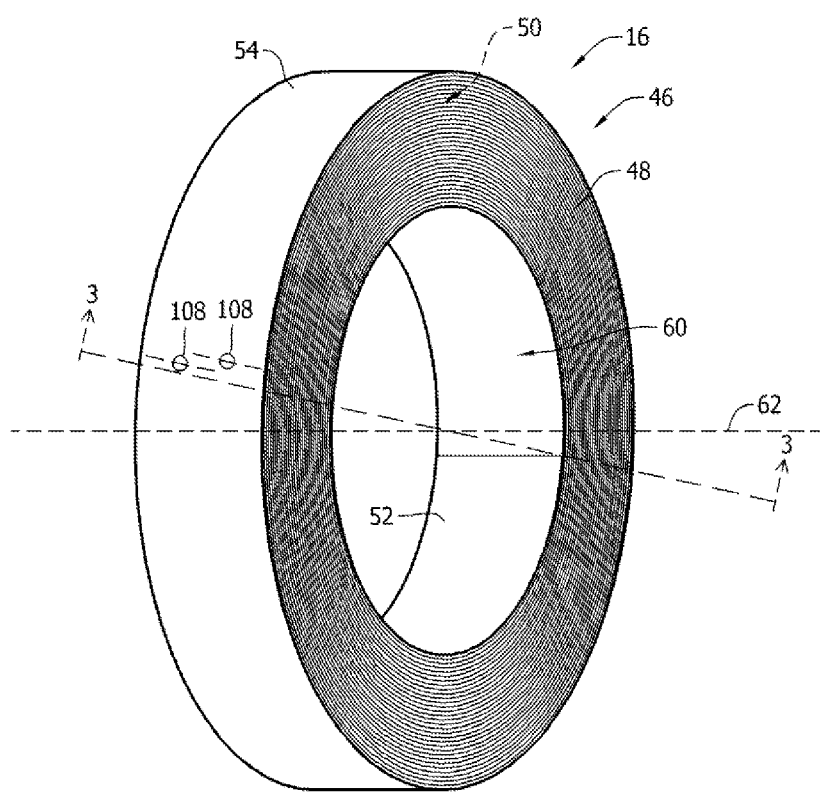
FIG. 2 is a perspective view of the current transformer assembly shown in FIG. 1.
Figure 3:
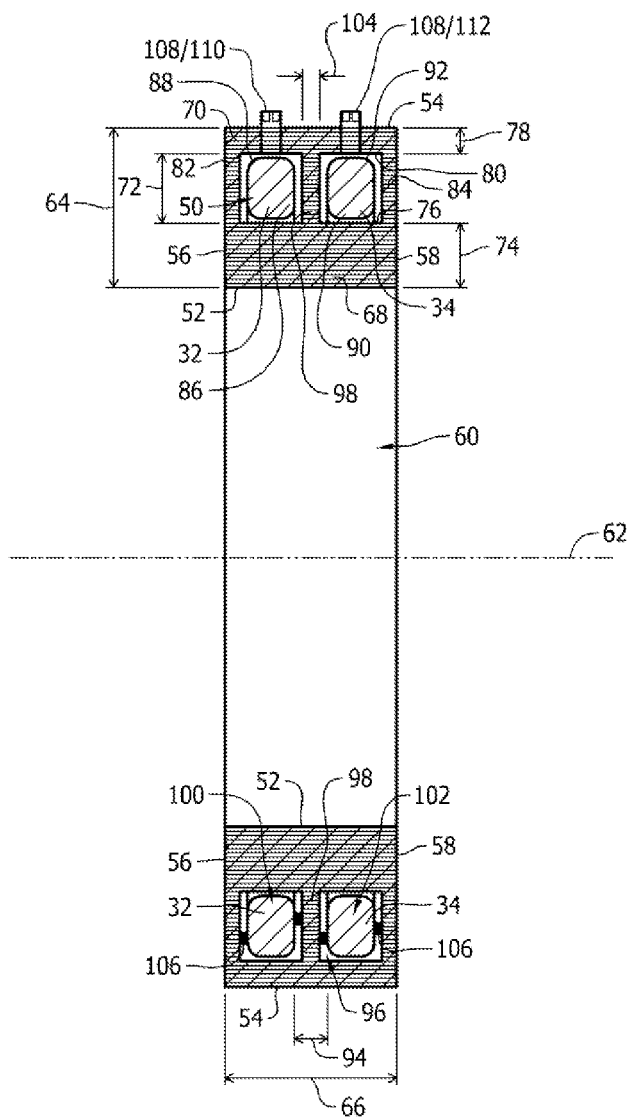
FIG. 3 is a cross-sectional view of the current transformer assembly shown in FIG. 2 and taken along line 3-3.
Figure 4:
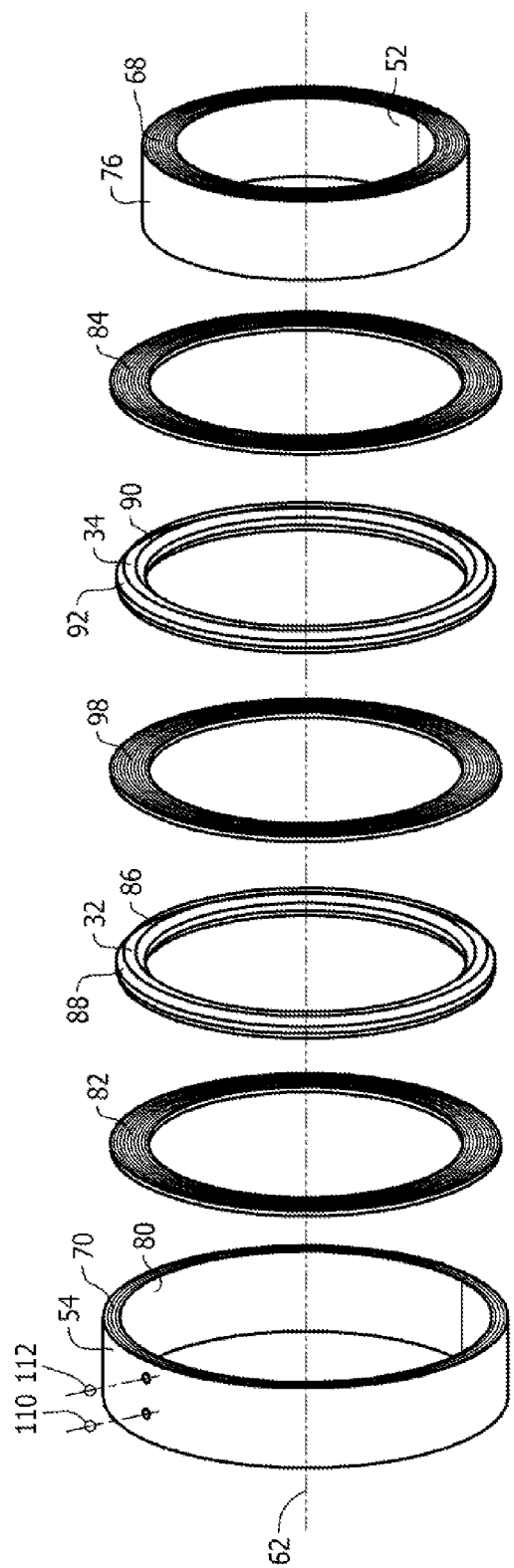
FIG. 4 is an exploded perspective view of the current transformer assembly shown in FIG. 2.

FIG. 2 is a perspective view of current transformer assembly 16. FIG. 3 is a cross-sectional view of current transformer assembly 16 taken along lines 3-3. FIG. 4 is an exploded perspective view of current transformer assembly 16. Identical components shown in FIGS. 2-4 are labeled with the same reference numbers used in FIG. 1. In the exemplary embodiment, current transformer assembly 16 includes a housing 46 including a plurality of shielding members 48 coupled together to define a cavity 50 that is sized to receive protection current transformer 32 and high sensitivity current transformer 34 therein. In the exemplary embodiment, each shielding member 48 includes a plurality of tape-wound silicon steel layers (not shown) to facilitate reducing an amount of electrical interference imparted to current transformers 32 and 34 from housing 46. Alternatively, shielding members 48 may include any suitable material to enable housing 46 to function as described herein.

Housing 46 extends radially between a radially inner surface 52 and a radially outer surface 54, and axially between a forward surface 56 and an opposite aft surface 58. Radially inner surface 52 defines a central opening 60 that extends substantially axially through housing 46. In the exemplary embodiment, housing 46 has a substantially cylindrical shape such that opening 60 is oriented along a centerline axis 62. Alternatively, housing 46 may be triangular, a square, rectangular, or polygonal. Housing 46 extends radially for a width 64 measured between inner and outer surfaces 52 and 54, and extends axially for a length 66 measured between forward and aft surfaces 56 and 58. Forward and aft surfaces 56 and 58 each extend between inner surface 52 and outer surface 54.

In the exemplary embodiment, housing 46 includes an inner shielding member 68 and an outer shielding member 70 that are each coupled radially outwardly from inner shielding member 68. Outer shielding member 70 is spaced a radial distance 72 from inner shielding member 68 such that cavity 50 is defined between inner and outer shielding members 68 and 70. Inner shielding member 68 defines radially inner surface 52 and extends radially for a width 74 measured between inner surface 52 and an outer surface 76. Outer shielding member 70 includes outer surface 54 and extends radially for a width 78 measured between outer surface 54 and an inner surface 80. In the exemplary embodiment, width 74 is greater than width 78. Alternatively, width 74 may be less than, or approximately equal to, width 78.

Housing 46 also includes a first side shielding member 82 and an opposite second side shielding member 84. Inner and outer shielding members 68 and 70 each extend along axis 62 from first side shielding member 82 to second side shielding member 84. More specifically, first and second side members 82 and 84 each extend radially between inner and outer shielding members 68 and 70. In the exemplary embodiment, inner member 68, outer member 70, first side shielding member 82, and second side shielding member 84 are coupled together such that cavity 50 is defined between members 68, 70, 82, and 84.

Protection current transformer 32 is positioned within housing cavity 50 and is oriented between inner shielding member 68 and outer shielding member 70. Protection current transformer 32 includes a magnetic core 86 that is oriented with respect to axis 62 and includes an outer surface 88 that circumscribes inner shielding member 68. Moreover, in the exemplary embodiment, high sensitivity current transformer 34 is also positioned within cavity 50 and is oriented between inner shielding member 68 and outer shielding member 70. High sensitivity current transformer 34 is oriented with respect to axis 62 and includes a magnetic core 90 that has an outer surface 92 that circumscribes inner shielding member 68. High sensitivity current transformer 34 is spaced axially for a distance 94 from protection current transformer 32 to facilitate reducing an amount of electrical noise interference between protection current transformer 32 and high sensitivity current transformer 34. Moreover, a gap 96 is defined between protection current transformer 32 and high sensitivity current transformer 34.

In the exemplary embodiment, housing 46 also includes an internal shielding member 98 that is positioned within gap 96 and oriented between protection current transformer 32 and high sensitivity current transformer 34 to facilitate reducing an amount of electrical noise interference between protection current transformer 32 and high sensitivity current transformer 34. Internal shielding member 98 is coupled radially between inner shielding member 68 and outer shielding member 70, and is coupled axially between first and second side shielding members 82 and 84. Internal shielding member 98 is positioned within cavity 50 such that a first chamber 100 and a second chamber 102 are defined therein. First chamber 100 extends between internal shielding member 98 and first side shielding member 82, and is sized and shaped to receive protection current transformer 32 therein. Second chamber 102 extends between internal shielding member 98 and second side shielding member 84, and is sized and shaped to receive high sensitivity current transformer 34 therein. In the exemplary embodiment, internal shielding member 98 has an axial width 104 measured along axis 62. Moreover member 98 is sized to facilitate reducing an amount of electrical noise interference between protection current transformer 32 and high sensitivity current transformer 34. In the exemplary embodiment, housing 46 includes plurality of spacers 106 that each extend outwardly from shielding members 68, 70, 82, and/or 84 to facilitate supporting current transformers 32 and/or 34 within housing cavity 50. Each spacer 106 is oriented to contact protection current transformer 32 and/or high sensitivity current transformer 34 such that an orientation of current transformers 32 and 34 is maintained with respect to housing 46 and axis 62.

In the exemplary embodiment, housing 46 also includes at least one connector assembly 108 that extends through outer shielding member 70 to couple current transformers 32 and/or 34 to monitoring device 14. In the exemplary embodiment, housing 46 includes one or more protection connector assemblies 110 that extend through outer shielding member 70 to couple protection current transformer 32 to monitoring device 14. Housing 46 also includes one or more diagnostic connector assemblies 112 that extend through outer shielding member 70 to couple high sensitivity current transformer 34 to monitoring device 14.

Figure 5:
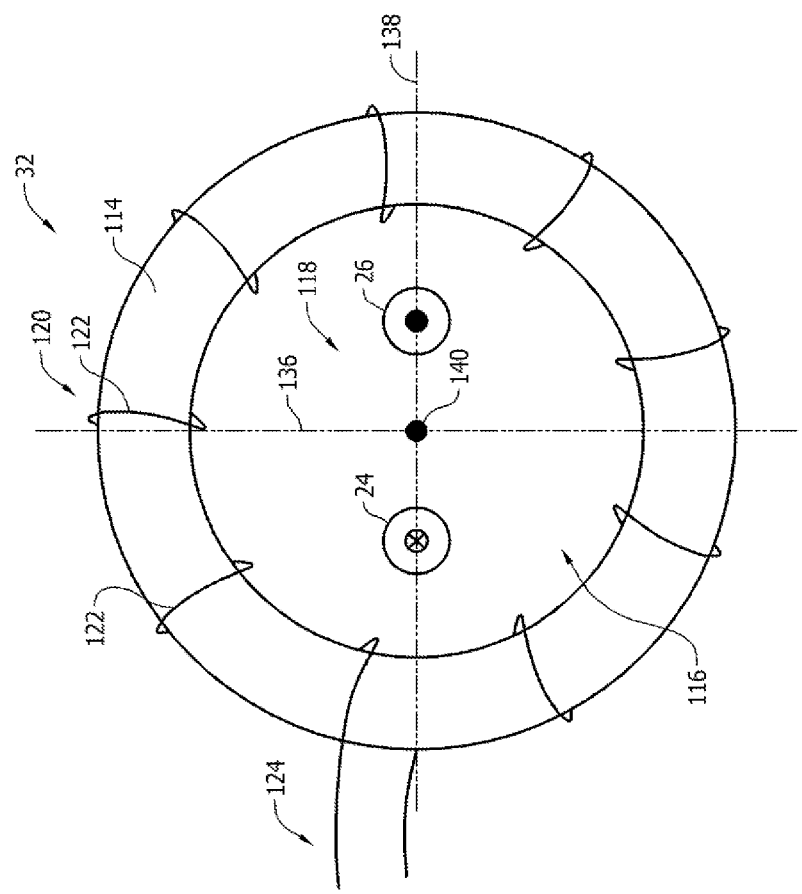
FIG. 5 is schematic view of a protection current transformer that may be used with the current transformer assembly shown in FIG. 2.
Figure 6:
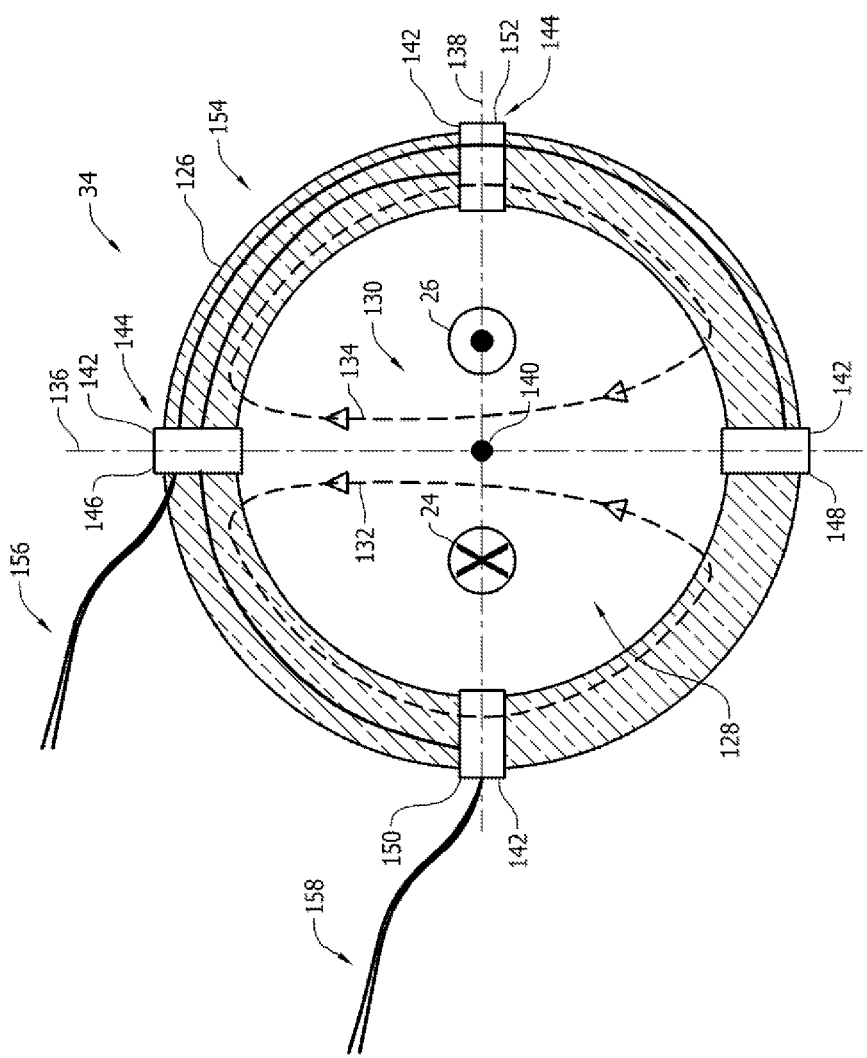
FIG. 6 is a schematic view of a high sensitivity current transformer that may be used with the current transformer assembly shown in FIG. 2.

FIG. 5 is a schematic view of protection current transformer 32. FIG. 6 is a schematic view of high sensitivity current transformer 34. In the exemplary embodiment, protection current transformer 32 includes a magnetic core 114 that defines a central opening 116 that is sized to receive first and second conductors 24 and 26 therethrough. First and second conductors 24 and 26 form a primary winding 118 of protection current transformer 32. Protection current transformer 32 also includes a secondary winding 120 that includes a plurality of winding turns 122 that are wound about magnetic core 114. Secondary winding 120 includes a terminal 124 that is coupled to protection connector assembly 110 to electrically couple protection current transformer 32 to monitoring device 14.

In the exemplary embodiment, high sensitivity current transformer 34 includes a magnetic core 126 that defines a central opening 128. Opening 128 is sized to receive first and second conductors 24 and 26 therethrough. First and second conductors 24 and 26 form a primary winding 130 for high sensitivity current transformer 34. In the exemplary embodiment, first and second conductors 24 and 26 carry substantially similar currents in opposite directions. As shown in FIG. 6, first conductor 24 may generate a magnetic flux, represented by arrow 132, and second conductor 26 may generate an opposite magnetic flux, represented by arrow 134. The poles of magnetic flux patterns 132 and 134 define a magnetic neutral axis 136 that is substantially perpendicular to a reference axis 138. In the exemplary embodiment, first conductor 24 and second conductor 26 are oriented symmetrically with respect to a center point 140 of magnetic core 126. More specifically, first conductor 24 and second conductor 26 are each positioned along reference axis 138 such that magnetic neutral axis 136 is substantially perpendicular to first and second conductors 24 and 26.

In the exemplary embodiments, high sensitivity current transformer 34 includes a plurality of windings 142. Each winding 142 includes a plurality of winding turns 144 that are wound about magnetic core 126. Each winding turn 144 is positioned in close proximity to an adjacent winding turn 144 such that each winding 142 is formed from a tightly packed set of winding turns 144.

In the exemplary embodiment, high sensitivity current transformer 34 includes a first winding 146, a second winding 148, a third winding 150 and a fourth winding 152, that are each positioned on magnetic core 126. Magnetic flux patterns 132 and 134 generated by first and second conductors 24 and 26 induce a current in windings 146, 148, 150, and 152. Windings 146, 148, 150, and 152 form a secondary winding 154 for high sensitivity current transformer 34. In the exemplary embodiment, first winding 146 is coupled to second winding 148, and third winding 150 is coupled to fourth winding 152. First and second windings 146 and 148 are each coupled to a first terminal 156 such that first and second windings 146 and 148 are coupled to monitoring device 14. Similarly, third and fourth windings 150 and 152 are each coupled to a second terminal 158 to enable third and fourth windings 150 and 152 to couple to monitoring device 14. In the exemplary embodiment, first and second windings 146 and 148 are positioned along magnetic neutral axis 136 for sensing leakage current within first and second conductors 24 and 26. Third and fourth windings 150 and 152 are oriented along reference axis 138 for sensing a partial discharge and/or load currents carried by first and second conductors 24 and 26.

In the exemplary embodiment, magnetic cores 114 and 126 each include a supermalloy that includes a magnetic material including nickel, molybdenum, and iron and having a high magnetic permeability. In addition, magnetic cores 114 and 126 may include silicon steel, alloys, and/or ferrites. In the exemplary embodiment, magnetic cores 114 and 126 have a substantially circular cross-sectional shape. Alternatively, magnetic cores 114 and 126 may be triangular, a square, rectangular, or polygonal.

The exemplary current transformers described herein may be used in a variety of applications such as motors, harmonic generators, turbine generators, wind generators, cables, Xformers, GIS, accelerators and photovoltaic panels, for example. Furthermore, the exemplary current transformers have several advantages over known current transformers, such as, but not limited to, a lower sensitivity to cable location in the central opening of the current transformers, a higher gain and ease of installation, ease of balancing, and more accurate and repeatable calibration.

During operation of electrical monitoring system 10, electrical current monitoring device 14 receives a monitoring signal from high sensitivity current transformer 34 that is indicative of a current differential between conductors 24 and 26 within the first range of current levels. Monitoring device 14 calculates a plurality of timebased differential current values with respect to a predefined period of time, and calculates a trending value of the differential current over time. Monitoring device 14 also displays a notification signal to user upon detecting a differential current within the first range of current levels, and displays a signal indicative of an increase in sensed differential current over time. In addition, in the exemplary embodiment, monitoring device 14 receives a monitoring signal from protection current transformer 32 that is indicative of a current differential between conductors 24 and 26 that is within the second range of current levels. Monitoring device 14 also determines a condition of the stator winding insulation of electric motor 18 to be less than a predefined condition if the sensed current differential is equal to, or greater than, a predefined differential current limit within the second range of current levels. Moreover, monitoring device 14 displays a notification signal on display 44 if the determined stator winding insulation condition is less than a predefined stator winding condition.

The orientation of the protection current transformer 32 and the high sensitivity current transformer 34 within housing 46 is selected to facilitate monitoring a differential current between conductors 24 and 26. In addition, the orientation, size, and shape of housing 46 is selected to facilitate reducing an amount of electrical noise interference generated between protection current transformer 32 and high sensitivity current transformer 34 and to protect the current transformers 32 and 34 from damage caused during installation and operation of the monitoring system 10.

The above-described apparatus and methods overcome at least some disadvantages of known monitoring devices by providing a monitoring system that includes a current transformer assembly that uses a high sensitivity current transformer and a protection current transformer. In addition, the current transformer assembly described herein includes a housing that is sized to enclose a protection current transformer and a high sensitivity current transformer therein to protect the current transformers from damage and to reduce an amount of electrical noise interference between the protection current transformer and the high sensitivity current transformer. By using a current transformer assembly that includes a protection current transformer and a high sensitivity current transformer positioned within a single housing, the cost of manufacturing a monitoring device for monitoring a condition of a stator winding insulation in an electric motor is reduced over known monitoring devices.

An exemplary technical effect of the methods, system, and apparatus described herein includes at least one of: (a) receiving, from a high sensitivity current transformer, a monitoring signal that is indicative of a current differential between a first conductor and a second conductor; (b) calculating a plurality of timebased differential current values with respect to a predefined period of time; (c) calculating a trending value of the differential current over time; and (d) displaying a signal indicative of an increase in sensed differential current over time.

Exemplary embodiments of a current transformer assembly for use with an electrical monitoring system and methods of assembling the current transformer assembly are described above in detail. The systems and methods are not limited to the specific embodiments described herein, but rather, components of the systems and/or steps of the methods may be utilized independently and separately from other components and/or steps described herein. For example, the methods may also be used in combination with other electrical monitoring systems, and are not limited to practice with only the electrical monitoring system as described herein. Rather, the exemplary embodiment can be implemented and utilized in connection with many other monitoring system applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A current transformer assembly for use in an electrical monitoring system, said current transformer assembly comprising:
   a housing comprising a plurality of shielding members that at least partially define a cavity therein, said housing further comprising an inner surface defining an opening extending therethough, wherein said housing comprises:
   an inner shielding member comprising a radially inner surface defining said housing opening, and a radially outer surface at least partially defining said housing cavity; and
   an outer shielding member coupled radially outwardly from said inner shielding member such that said housing cavity extends between said inner shielding member and said outer shielding member;
a first current transformer positioned within said housing; and
a second current transformer positioned within said housing and spaced a distance from said first current transformer to facilitate reducing electronic noise interference between said first and second current transformers.

2. The current transformer assembly in accordance with claim 1, further comprising a protection connector assembly electrically coupled to said first current transformer, said protection connector assembly extending through said outer shielding member to electrically couple said first current transformer to the electrical monitoring system.

3. The current transformer assembly in accordance with claim 2, further comprising at least one diagnostic connector assembly electrically coupled to said second current transformer, said diagnostic connector assembly extending through said outer shielding member to electrically couple said second current transformer to the electrical monitoring system.

4. The current transformer assembly in accordance with claim 1, wherein said internal shielding member is configured to facilitate reducing electronic noise interference between said first and second current transformers.

5. The current transformer assembly in accordance with claim 4, wherein said internal shielding member comprises at least one spacer extending outwardly from said internal shielding member.

6. The current transformer assembly in accordance with claim 1, wherein said first current transformer comprises a magnetic core having a closed central opening and a winding, said winding comprises a plurality of winding turns wound about an outer surface of said magnetic core.

7. The current transformer assembly in accordance with claim 6, wherein said second current transformer comprises a second magnetic core having a closed central opening and a plurality of windings coupled to a second outer surface of said second magnetic core, each winding of said plurality of windings comprising a plurality of winding turns wound about said second outer surface.

8. An electrical monitoring system for monitoring an operation of an electric motor, said electrical monitoring system comprising:
   an electric current monitoring device; and
   a current transformer assembly coupled to the electric motor, said current transformer configured to sense an electric current channeled to the electric motor and to transmit a signal indicative of the sensed current to said electric current monitoring device, said current transformer assembly comprising:
      a housing comprising a plurality of shielding members that at least partially define a cavity therein, said housing further comprising an inner surface defining an opening extending therethough, wherein said housing comprises:
         an inner shielding member comprising a radially inner surface defining said housing opening, and a radially outer surface at least partially defining said housing cavity; and
         an outer shielding member coupled radially outwardly from said inner shielding member such that said housing cavity extends between said inner shielding member and said outer shielding member;
      a first current transformer positioned within said housing; and
      a second current transformer positioned within said housing and spaced a distance from said first current transformer to facilitate reducing electronic noise interference between said first and second current transformers.

9. The electrical monitoring system in accordance with claim 8, wherein said current transformer assembly further comprises a protection connector assembly electrically coupled to said first current transformer, said protection connector assembly extending through said outer shielding member to electrically couple said first current transformer to the electric current monitoring device.

10. The electrical monitoring system in accordance with claim 9, wherein said current transformer assembly further comprises at least one diagnostic connector assembly electrically coupled to said second current transformer, said diagnostic connector assembly extending through said outer shielding member to electrically couple said second current transformer to the electric current monitoring device.

11. The electrical monitoring system in accordance with claim 8, wherein said housing comprises an internal shielding member between said first and second current transformers to facilitate reducing electronic noise interference between said first and second current transformers.

12. The electrical monitoring system in accordance with claim 11, wherein said internal shielding member comprises at least one spacer extending outwardly from said internal shielding member.

13. The electrical monitoring system in accordance with claim 8, wherein said first current transformer comprises a magnetic core having a closed central opening and a winding, said winding comprises a plurality of winding turns wound about an outer surface of said magnetic core.

14. The electrical monitoring system in accordance with claim 13, wherein said second current transformer comprises a second magnetic core having a closed central opening and a plurality of windings coupled to a second outer surface of said second magnetic core, each winding of said plurality of windings comprising a plurality of winding turns wound about said second outer surface.

15. A method of assembling a current transformer assembly, said method comprising:
   coupling an outer shielding member to an inner shielding member to form a housing, wherein the outer shielding member is coupled radially outwardly from the inner shielding member such that a cavity is defined between the inner and outer shielding members;
   coupling a first current transformer within the housing cavity; and
   coupling a second current transformer within the housing cavity such that the second current transformer is spaced a distance from the first current transformer to reduce electronic noise interference between the first and second current transformers.

16. The method in accordance with claim 15, further comprising coupling an internal shielding member within the housing cavity, wherein the internal shielding member is between the first and second current transformers to facilitate reducing electronic noise interference between the first and second current transformers.

17. The method in accordance with claim 15, further comprising:
- coupling a protection connector assembly to the first current transformer and to the outer shielding member, wherein the protection connector assembly extends through an outer surface of the outer shielding member; and
- coupling one or more diagnostic connector assemblies to said second current transformer, wherein the diagnostic connector assemblies extend through the outer shielding member outer surface.

18. The method in accordance with claim 15,
- wherein the first current transformer includes a first magnetic core having a closed central opening and a winding, the winding including a plurality of winding turns wound about the first magnetic core; and
- wherein the second current transformer includes a second magnetic core having a closed central opening and a plurality of windings coupled to the second magnetic core, each winding of the plurality of windings having a plurality of winding turns wound about the second magnetic core.

* * * * *